United States Patent
Nakazato et al.

(10) Patent No.: US 7,471,544 B2
(45) Date of Patent: Dec. 30, 2008

(54) METHOD AND APPARATUS FOR AVOIDING CELL DATA DESTRUCTION CAUSED BY SRAM CELL INSTABILITY

(75) Inventors: Takaai Nakazato, Austin, TX (US); Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 11/444,019

(22) Filed: May 31, 2006

(65) Prior Publication Data

US 2007/0279965 A1    Dec. 6, 2007

(51) Int. Cl.
*G11C 11/00*    (2006.01)
(52) U.S. Cl. .................. 365/154; 365/189.04; 365/203; 365/230.05
(58) Field of Classification Search ................ 365/154, 365/189.04, 203, 230.05
See application file for complete search history.

(56) References Cited

U.S. PATENT DOCUMENTS 6,831,871 B2    12/2004    Khellah

2005/0002215 A1*   1/2005    Morishima ................. 365/120
2006/0227595 A1*   10/2006   Chuang et al. ............. 365/154
2007/0297249 A1*   12/2007   Chang et al. ........... 365/189.11

* cited by examiner

*Primary Examiner*—Anh Phung
*Assistant Examiner*—Toan Le
(74) *Attorney, Agent, or Firm*—Sprinkle IP Law Group

(57) ABSTRACT

Disclosed are embodiments of a method and apparatus for avoiding cell data destruction caused by cell stability problems in static random access memory (SRAM) cells. In one embodiment, data inside of an SRAM cell is transferred to one of its bitline in advance of an actual Read/Write operation utilizing a transfer device controlled by a pre-read signal. In one embodiment, the read and write bitlines are shared and the transfer device and pr are not needed. Since the bitline voltage has already been changed to the state which reflects the cell data in advance, the memory cells remains relatively stable. By shifting the bitline voltage before the wordline is turned on, the accessed cell is relieved from the stress which would have otherwise caused cell stability problems.

15 Claims, 14 Drawing Sheets

US 7,471,544 B2

1

METHOD AND APPARATUS FOR AVOIDING CELL DATA DESTRUCTION CAUSED BY SRAM CELL INSTABILITY

FIELD OF THE INVENTION

This invention relates generally to static random access memory devices. More particularly, embodiments of the present invention relate to a method and apparatus for avoiding cell data destruction caused by stability problems in SRAM cells.

BACKGROUND OF THE INVENTION

A static random access memory (SRAM) typically includes an array of memory cells and peripheral circuits. Each cell generally comprises at least 6 transistors, a word line, and two bit lines. An SRAM is generally driven by low power and operates at reasonably high speeds. As the complementary metal oxide semiconductor (CMOS) technology continues to scale down in the submicron range, designing SRAM devices faces many complex challenges. Among these challenges, cell stability is one that must be addressed.

Cell stability relates to the ability of a cell to resist accidental overwrites during various operating conditions (e.g., noise due to transistor mismatch, threshold variations, etc.). In an SRAM array, cells can suffer from problems related to cell stability during Read/Write operations. Smaller current requires more time to develop a signal, making it harder to write into cell 100. On the other hand, when cell 100 is operating under a scenario in which both bitlines are near the supply voltage (Vdd) state and the wordline is on, data stored in the cell may be flipped unexpectedly.

FIG. 1 is a schematic representation of an exemplary CMOS six-transistor (6T) SRAM cell 100. Cell 100 uses six transistors (P0, P1, N0, N1, N2, N3) to store and access one bit. The four transistors in the center form two cross-coupled inverters (tru, cmp). For the sake of discussion, assuming that wordline wl switches on when the voltage of "tru" (Vtru) is high, the voltage of "cmp" (Vcmp) is low, and the voltage of bitlines (Vblt and Vblc) are high. When wl is off, P0 and N1 are on, and P1 and N0 are off. When wl is on, Vcmp is raised because Vblc is high. The amount raised is decided by the conductance ratio of transfer gate N3 and pull down device N1. If the amount is high enough to turn N0 on and turn P0 off, Vtru goes down slightly. This causes N1 turns slightly off and P1 turns slightly on, which enhances Vcmp (i.e., goes up) which, in turn, turns N0 on stronger than before. With this positive feedback mechanism, Vtru eventually settles to low and Vcmp eventually settles to high. As long as wl is kept low, cell 100 is disconnected from the bitlines and the inverters can keep feeding themselves, allowing cell 100 to store its current value. However, as described above, when cell 100 is exposed to a situation where wl is on and both blt and blc are near the Vdd state, the state of cell 100 may be flipped unexpectedly, destroying data stored therein.

In the SRAM array, cells can suffer from the aforementioned cell stability problems during both Read and Write operations, causing undesirable cell data destruction. In some cases, these cell stability problems may be addressed by modifying cell size, array structure (single column or multi-column), and/or access pattern (i.e., during Read or Write operation). Some prior attempts are described below with reference to FIG. 2-FIG. 8.

2

FIG. 2 is a schematic representation of an exemplary 6T SRAM array 200 having a single-column structure. In this structure, each column has an input, a Read Circuit, a Write Circuit, and an output.

An exemplary Read operation can be performed as follows. First, the bitlines are precharged to high. Then, the precharge device is turned off and the wordline is turned on. Each memory cell pulls either of the bitlines down, depending upon whether "0" or "1" had been stored inside the cell. Read Circuit senses the voltage on the bitline and outputs the data. Then, the wordline shuts off. In some cases, in a Read operation, SRAM cell 100 may be exposed to a state where both bitline voltages are near the power supply voltage (Vdd) right after the wordline is turned on, causing a cell stability problem as described above.

An exemplary Write operation can be performed as follows. First, the bitlines are precharged to high. Then, the precharge devices are turned off and the wordline is turned on. Write Circuit pulls either of the bitlines down. The voltage on the bitline is transferred to a memory cell through its transfer gate. The state of the flip-flop in the memory cell settles. Then, the wordline shuts off. Because an activated cell is eventually written (i.e., overpowered) by Write Circuit in 6T SRAM array 200, cell stability is not a cause for concern during the Write operation.

FIG. 3 is a schematic representation of an exemplary 6T SRAM array 300 having a multi-column structure. In this structure, there are m columns and an m-to-1 multiplexer (m:1 MUX) is used to select a column. The Read and Write operations can be performed in basically the same manner as described above with reference to FIG. 2. One difference is that, when a certain column is accessed, all the other columns would be affected by the cell stability problem in both the Read and Write operations. For example, assume that a Write happens to column 1 (col_1). First, the bitlines for columns are precharged to high. Then, the precharge device is turned off and the wordline is turned on. Write Circuit pulls either of the bitlines of col_1 down. At this moment, the voltage of the bitlines of all neighboring columns (col_2 to col_m) are all near Vdd and the wordline is on, which means that they have a cell stability problem. Similarly, in a Read operation, not only the accessed column but also the unselected columns will have this cell stability problem.

Some have tried to use 8T and 10T SRAM cells to address the cell stability problem in the Read operation. FIG. 4 is a schematic representation of an exemplary 8T SRAM cell 400. FIG. 5 is a schematic representation of an exemplary 10T SRAM cell 500. In both cases, wwl is used for the Write operation, and rwl is used for the Read operation. When rwl is on, the voltage of node "tru_r" is raised, but this does not propagate to node "cmp". This means that the positive feedback mechanism, which causes a 6T SRAM cell to be unstable as described above, is absent in 8T and 10T SRAM cells during the Read operation.

FIG. 6 is a schematic representation of an exemplary 8T SRAM array 600 having a single-column structure. An exemplary Read operation can be performed as follows. First, the bitlines are precharged to high. Then, the precharge device is turned off and the read wordline (rwl) is turned on. Each bitline is pulled down or stays high according to cell data stored therein. Read Circuit senses the voltage on the bitline and outputs the data. Then, the wordline shuts off. As described above, each 8T SRAM cell in array 600 can avoid the cell stability problem in the Read operation. An exemplary Write operation can be performed as follows. First, the bitlines are precharged to high. Then, the precharge device is turned off and the wordline is turned on. Write Circuit pulls either of the bitlines down. The voltage on the bitline is transferred to a memory cell through its transfer gate, and the state of the flip-flop in the memory cell settles. Then, the wordline shuts off. Because an activated cell is eventually written by Write Circuit, cell stability is not a cause for concern for 8T SRAM array 600 during the Write operation.

FIG. 7 is a schematic representation of an exemplary 8T SRAM array 700 having a multi-column structure. In this structure, there are m columns and an m-to-1 multiplexer (m:1 MUX) is used to select a column (e.g., via colsel). The Read and Write operations can be performed in basically the same manner as described above with reference to FIG. 6. One difference is that, when a certain column is accessed, all the other columns would be affected by the cell stability problem in the Write operation. For example, assume that a Write happens to column 1 (col_1). First, the bitlines for columns are precharged to high via a precharge device (pc). Then, pc is turned off and the wordline is turned on. Write Circuit pulls either of the bitlines of col_1 down. At this moment, the voltage of bitlines of the other columns (col_2 to col_m) are all near Vdd and the wordline is on, indicating a cell stability problem. As described above, in a Read operation, all columns of 8T SRAM cells are free from the cell stability problem.

FIG. 8 is a schematic representation of an exemplary 10T SRAM array 800 having a multi-column structure. 10T SRAM array 800 comprises an array of 10T SRAM cells and operates basically in the same manner as 8T SRAM array 700. Each 10T SRAM cell can be similarly structured to perform like cell 500 described above with reference to FIG. 5.

To summarize, cell stability remains problematic in at least the following scenarios: during the Read operation in 6T SRAM arrays having a single-column structure; during the Read and Write operations in 6T SRAM arrays having a multi-column structure; and during the Write operation in 8T and 10T SRAM arrays having a multi-column structure. There is a need in the art to solve the cell stability problems represented in these scenarios. Embodiments of the present invention can address this need and more.

SUMMARY OF THE INVENTION

Embodiments of the present invention provide a method and apparatus for avoiding cell data destruction caused by cell stability problems in static random access memory (SRAM) devices. Embodiments of the invention can perform safe Read/Write operations on SRAM cells without affecting cell stability. More specifically, embodiments of the invention can transfer data inside of a cell to an appropriate bitline in advance of an actual Read/Write operation.

Such an advance or "preemptive" data transfer to the bitline can be done regardless of the column structure employed by the underlying SRAM array. In one embodiment, data inside of a cell is transferred, via a transfer device controlled by a pre-read signal, to the bitline before the wordline is turned on. By shifting the bitline voltage which reflects the cell data before the wordline is turned on, the accessed cell is thus relieved from the stress which would have otherwise caused cell stability problems in a conventional SRAM cell.

In one embodiment, the read and write bitlines are shared and the transfer device and pr are not needed. Since the bitline voltage has already been changed to the state which reflects the cell data in advance, the memory cells remains relatively stable, advantageously avoiding flipping the cell unexpectedly.

Other objects and advantages of the present invention will become apparent to one skilled in the art upon reading and understanding the detailed description of the preferred embodiments described herein with reference to the following drawings.

BRIEF DESCRIPTION OF THE DRAWINGS

A more complete understanding of the present invention and the advantages thereof may be acquired by referring to the following description, taken in conjunction with the accompanying drawings in which like reference numbers indicate like features.

DETAILED DESCRIPTION

The present invention and various features and advantageous details thereof will now be described with reference to the exemplary, and therefore non-limiting, embodiments that are illustrated in the accompanying drawings. Descriptions of known programming techniques, computer software, hardware, network communications, operating platforms and protocols may be omitted so as not to unnecessarily obscure the invention in detail. It should be understood, however, that the detailed description and the specific examples, while indicating preferred embodiments of the invention, are given by way of illustration only and not by way of limitation. Various possible substitutions, modifications, additions and/or rearrangements within the spirit and/or scope of the underlying inventive concept will become apparent to those skilled in the art from this disclosure.

Figure 1:
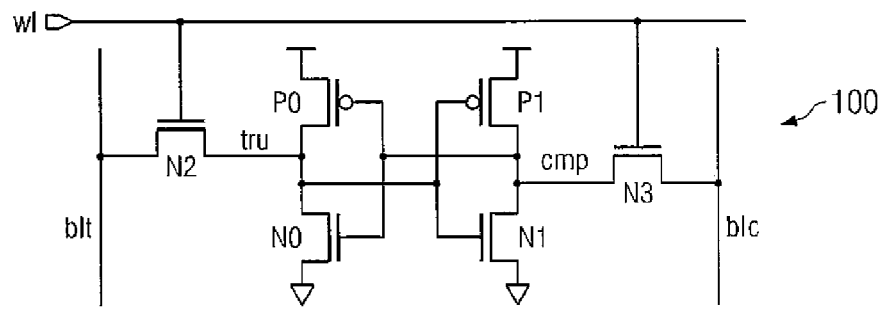
FIG. 1 is a schematic representation of an exemplary CMOS 6T SRAM cell.
Figure 4:
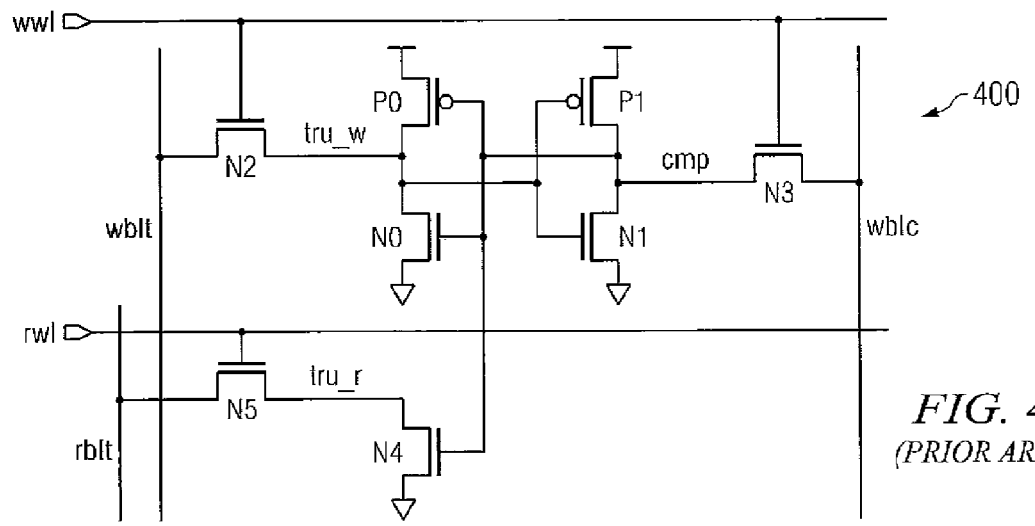
FIG. 4 is a schematic representation of an exemplary 8T SRAM cell.
Figure 5:
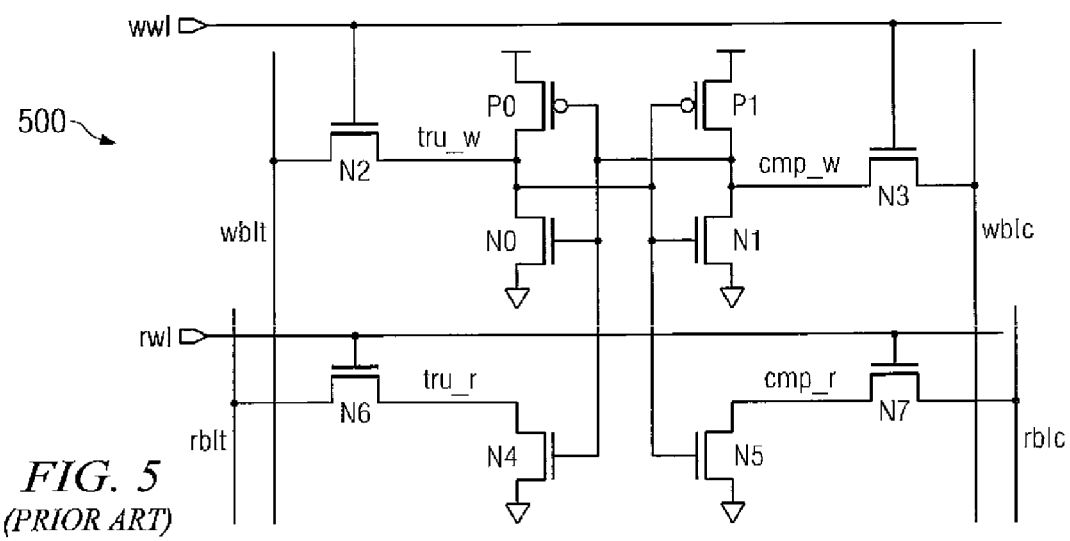
FIG. 5 is a schematic representation of an exemplary 10T SRAM cell.
Figure 2:
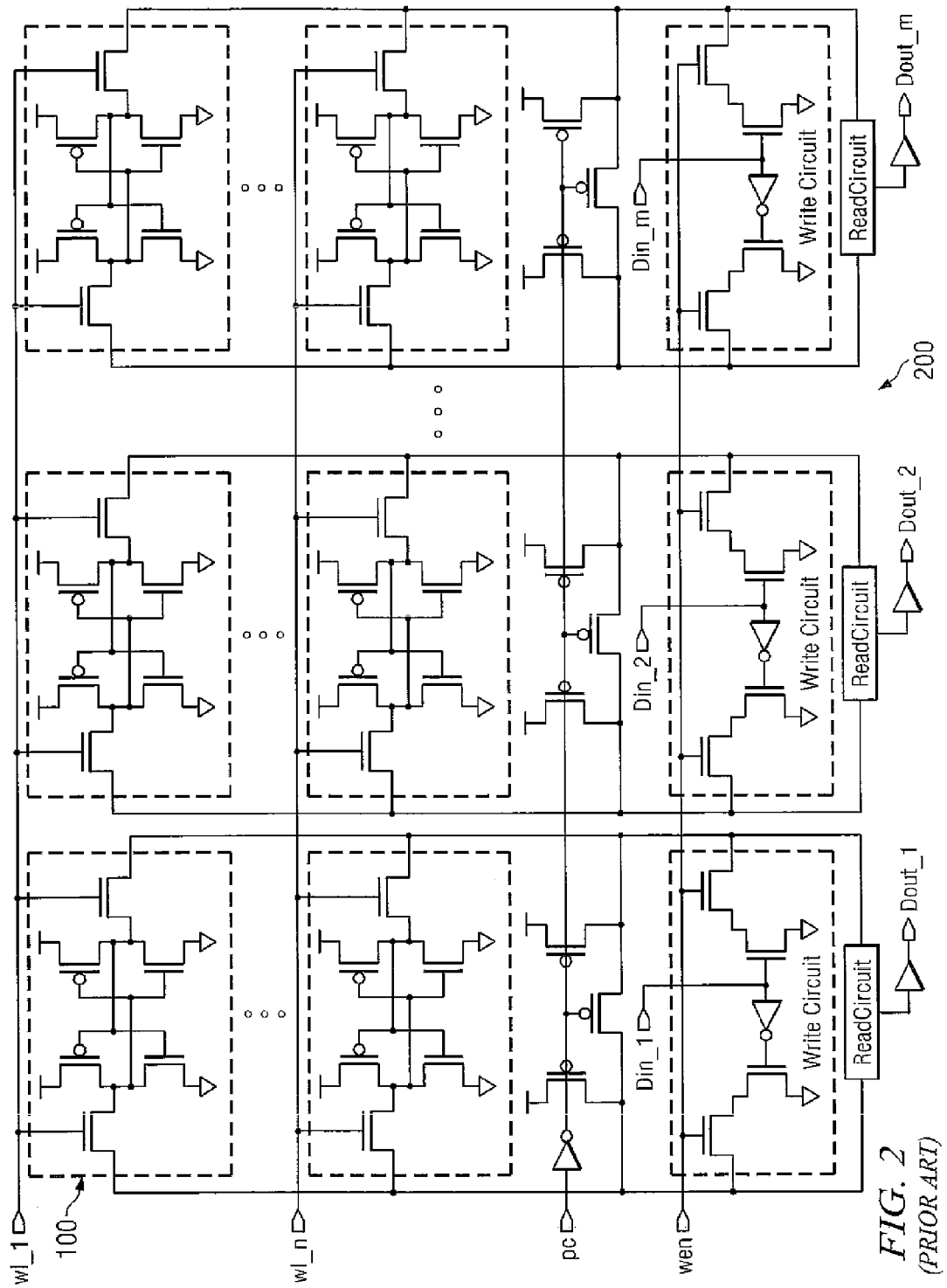
FIG. 2 is a schematic representation of an exemplary 6T SRAM array having single-column structure.
Figure 3:
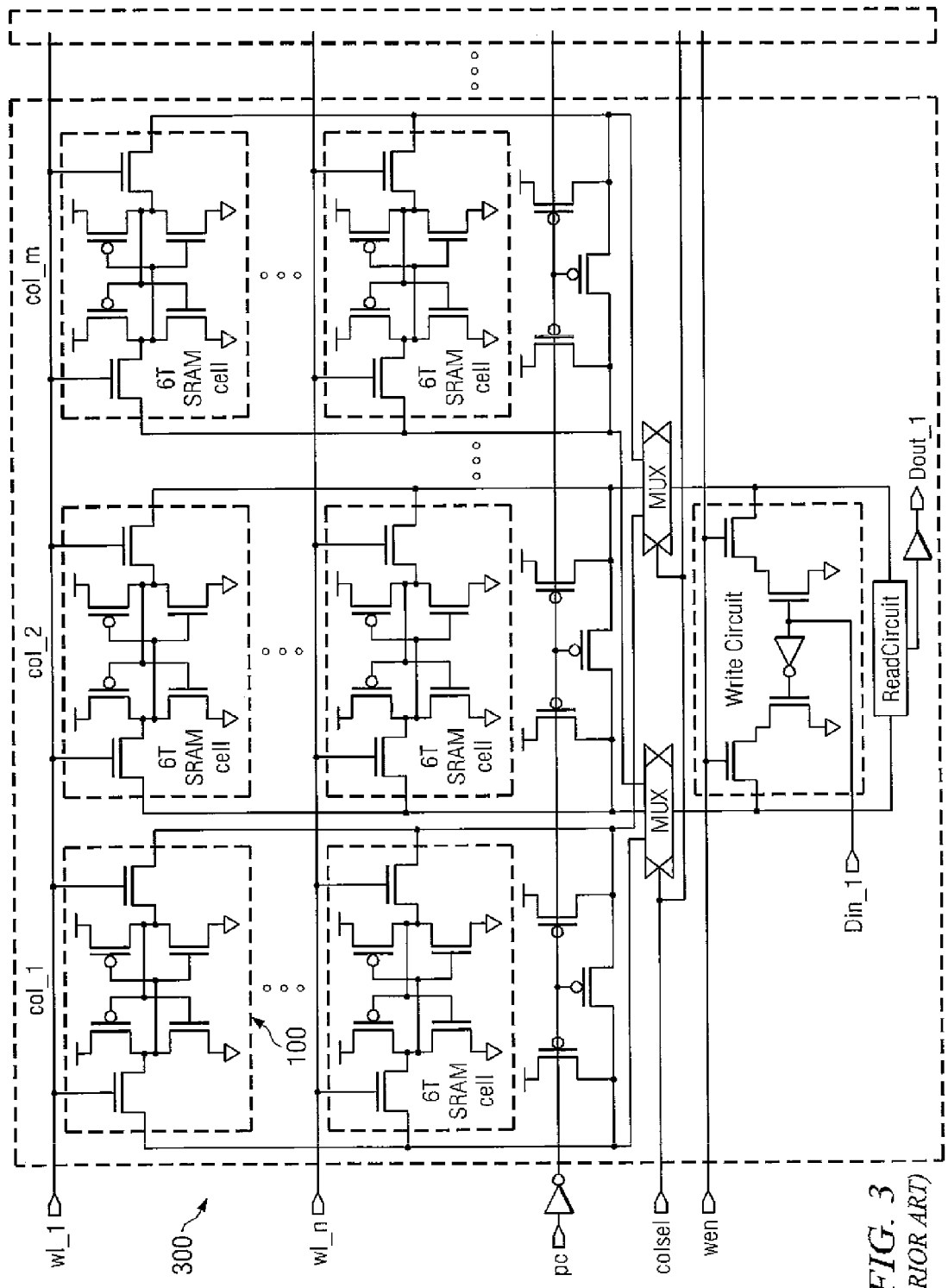
FIG. 3 is a schematic representation of an exemplary 6T SRAM array having a multi-column structure.
Figure 6:
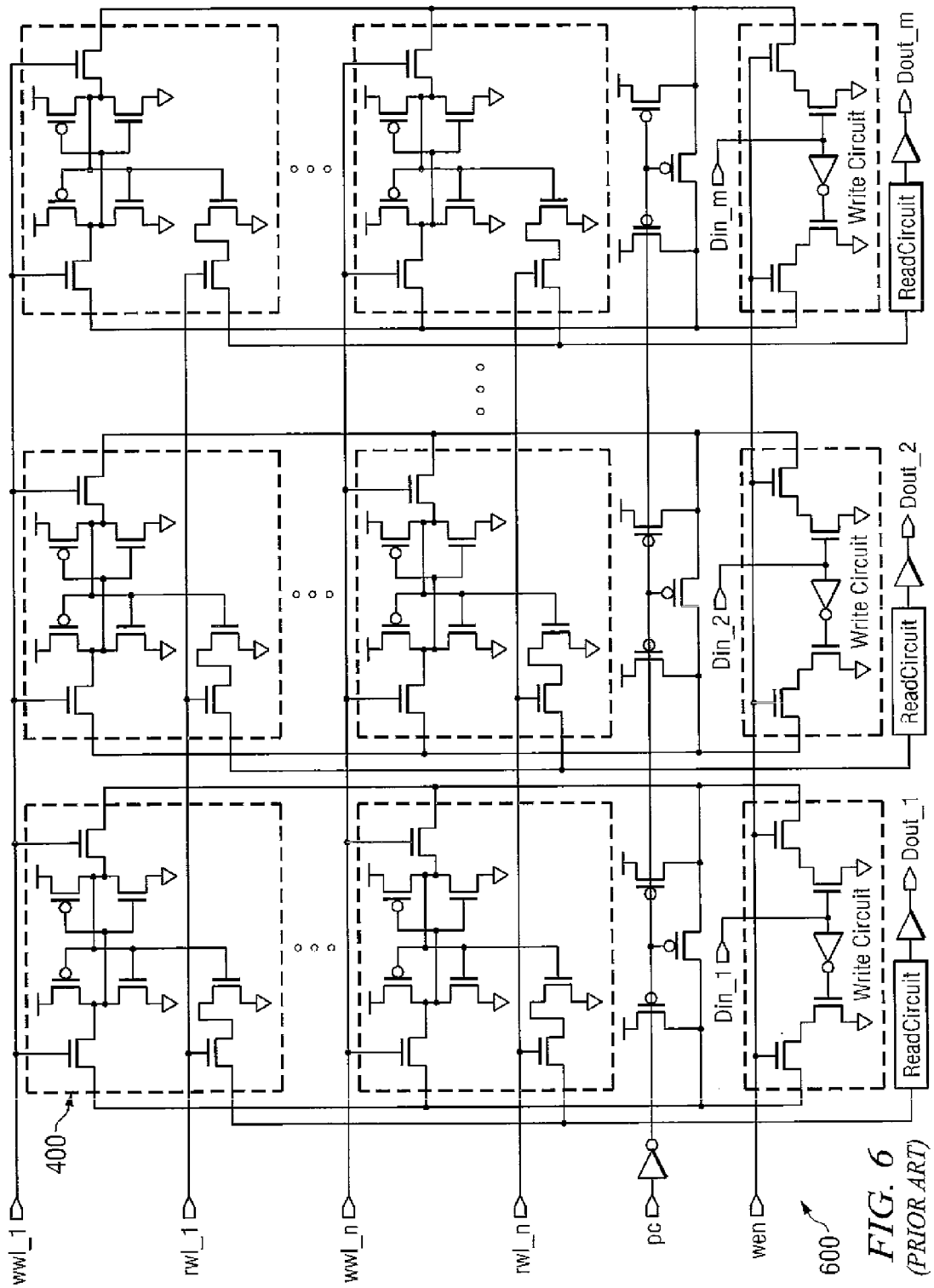
FIG. 6 is a schematic representation of an exemplary 8T SRAM array having a single-column structure.
Figure 9:
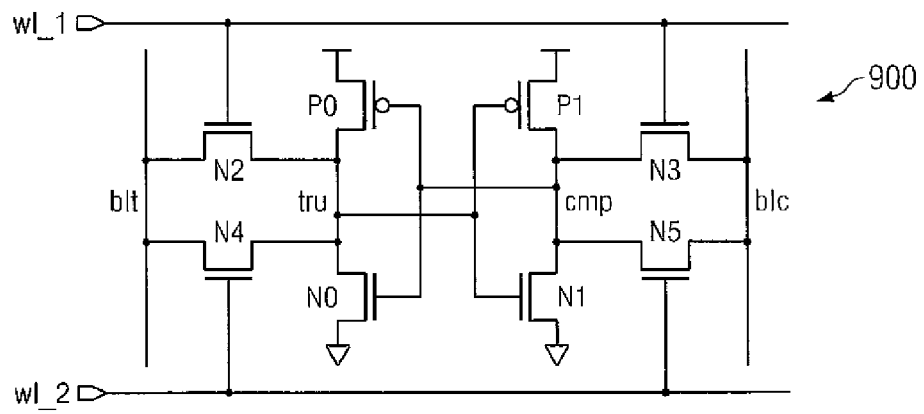
FIG. 9 is a schematic representation of a 6T SRAM cell according to one embodiment of the invention.

FIG. 9 is a schematic representation of a 6T SRAM cell 900 according to one embodiment of the invention. Structurally, cell 900 comprises two more transfer gates than a conventional 6T SRAM cell (e.g., cell 100 of FIG. 1). As depicted in FIG. 9, transfer gates N2 and N3 are controlled by a first wordline (wl_1) and transfer gates N4 and N5 are controlled by a second wordline (wl_2). The widths of transfer gates N2 and N4 are chosen in a manner such that their total cell current becomes the same as that of N2 in FIG. 1. Similarly, the widths of transfer gates N3 and N5 are chosen in a way so as to allow the total cell current becomes the same as that of N3 in FIG. 1. As one skilled in the art can appreciate, the current and supply voltage of an SRAM cell can vary depending upon a variety of factors (e.g., the number of cells on a bitline, the CMOS technology used in manufacturing the cell and/or the SRAM array, etc.). As an example, if the length of the polysilicon layer ($L_{poly}$) is 90 nm (known as the "$L_{poly}$=90 nm" generation of process technology), the current of an SRAM cell should be 60 μA, the number of the cells on a bitline should be 64, the supply voltage should be 1.0 V, and the bitline voltage should be below 800 mV. As an example, when writing data to cell 900, the first wordline gate opens and data stored inside cell 900 is transferred to the bitlines. Then, the second wordline gate opens. As the bitline voltage is shifted to a state which reflects the cell data in advance, the state of cell 900 can become difficult to flip, in part due to the reduced power supply voltage.

Figure 10:
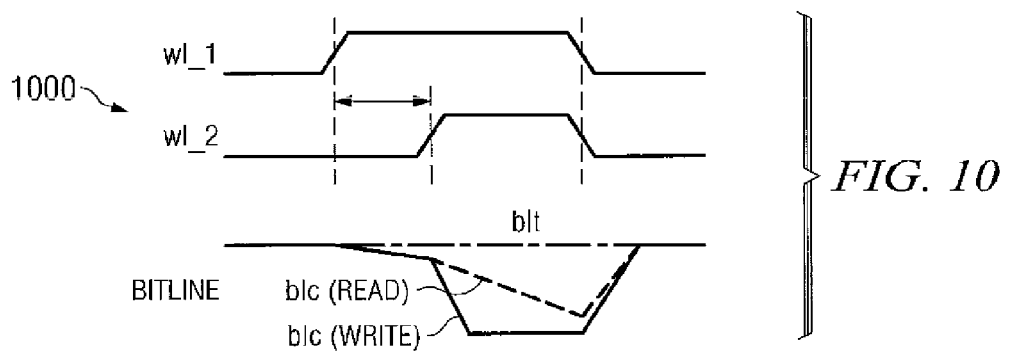
FIG. 10 is a diagrammatic representation of how signals can be controlled in accessing a 6T SRAM cell, according to one embodiment of the invention.

FIG. 10 is a diagrammatic representation of how signals can be controlled in accessing cell 900, according to one embodiment of the invention. Signal control method 1000 can be applied in a Read operation or a Write operation. First, the bitlines are precharged to high. Then, the precharge device is turned off and the first wordline (wl_1) is turned on. Since the width of N2 or N3 is small (i.e., reduced by about half or more from a typical transfer gate in a conventional 6T SRAM cell), the conductance ratio of N2/N0 or N3/N1 is correspondingly small. The low power design can facilitate cell stability. While wl_1 is on, depending upon whether data stored in cell 900 is "0" or "1", the voltage on either of the bitlines is lowered. When the bitline voltage drops to a threshold level, the second wordline (wl_2) is turned on. Following the above example with the "$L_{poly}$=90 nm" generation of process technology, precharge time for reading from/writing to the bitline(s) would be about 100 ps. The threshold of the bitline voltage could be set at 800 mA, below which wl_2 is turned on. Since the bitline voltage has already been changed to the state which reflects the cell data in advance, by the time wl_2 is turned on, the state of cell 900 is unlikely to flip unexpectedly. This addresses one of the aforementioned cell stability problems in which the state of a conventional SRAM cell may flip unexpectedly when both of the bitline voltages are high (i.e., near the power supply voltage Vdd).

Figure 11:
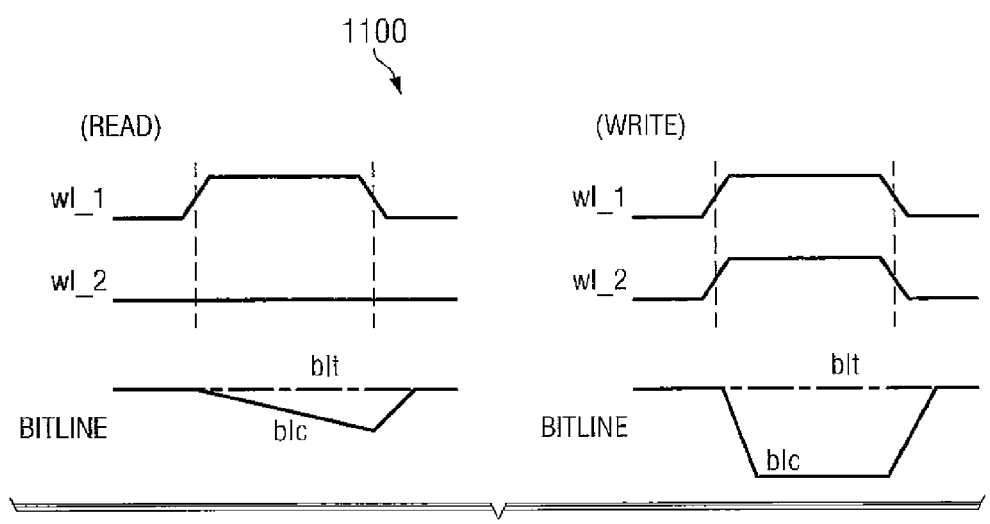
FIG. 11 is a diagrammatic representation of how signals can be controlled in accessing a 6T SRAM cell, according to another embodiment of the invention.

FIG. 11 is a diagrammatic representation of how signals can be controlled in accessing cell 900, according to another embodiment of the invention. In signal control method 1100, only wl_1 is turned on in the Read operation, while both wl_1 and wl_2 are turned on in the Write operation. One advantage of method 1100 is that it does not require a delay control circuit and consumes less power in the Read operation. A tradeoff could be that reading out is somewhat slower, making it less suitable for use in a multi-column structure.

Figure 12:
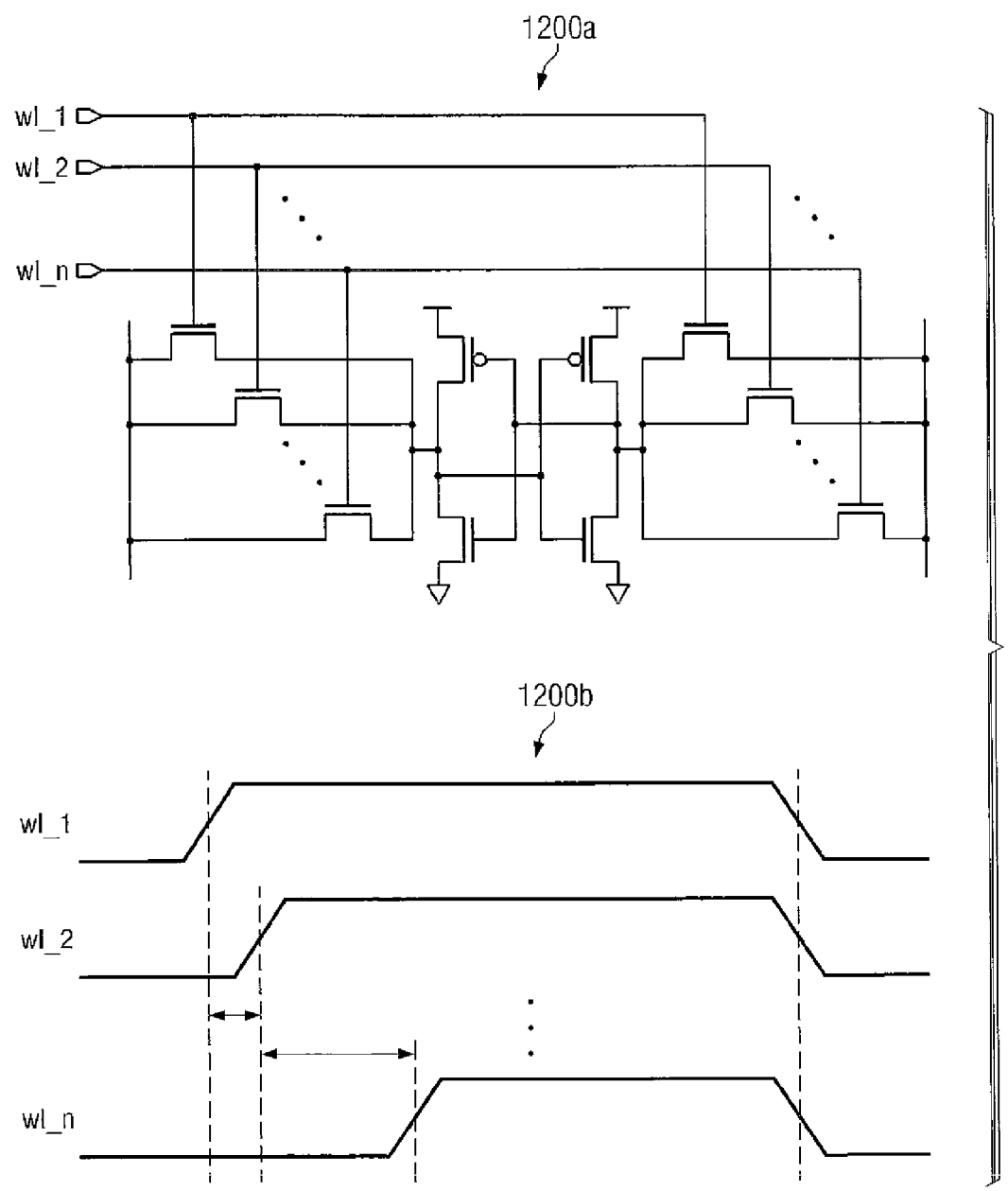
FIG. 12 schematically depicts a cell circuit with a plurality of wordlines and a corresponding waveform, according to one embodiment of the invention.
Figure 13:
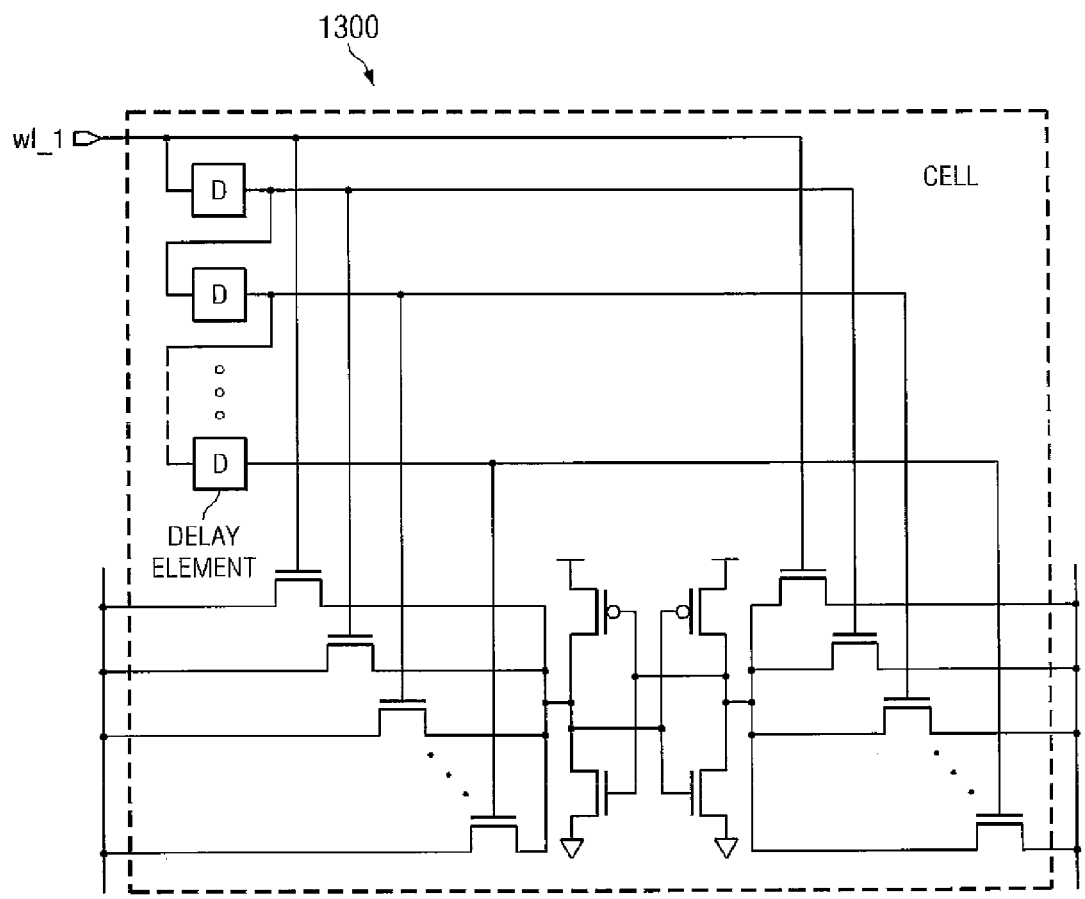
FIG. 13 schematically depicts a cell circuit with one wordline and a plurality of delay elements for generating a plurality of wordline signals inside the cell circuit, according to another embodiment of the invention.

Although two wordlines are utilized in the above-described embodiments, the number of wordlines can be increased to more than two. FIG. 12 schematically depicts a cell circuit 1200a with n wordlines (wl_1 ... wl_n) and a corresponding waveform 1200b which illustrates one example of how wl_1 ... wl_n may operate. As illustrated in FIG. 13, it is possible for cell 1300 to receive one wordline and create the rest of the wordline signals inside, utilizing delay elements.

Figure 7:
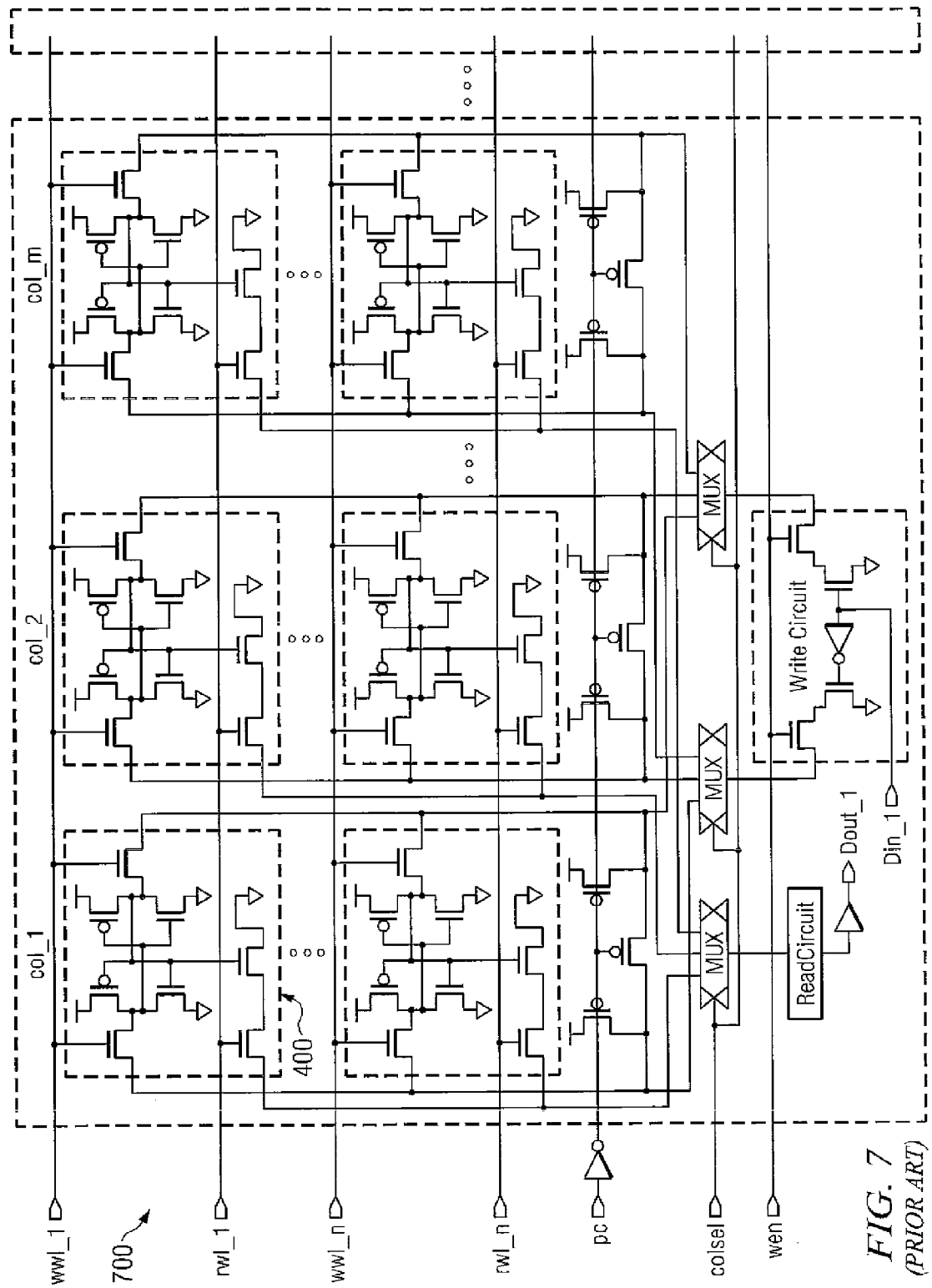
FIG. 7 is a schematic representation of an exemplary 8T SRAM array having a multi-column structure
Figure 8:
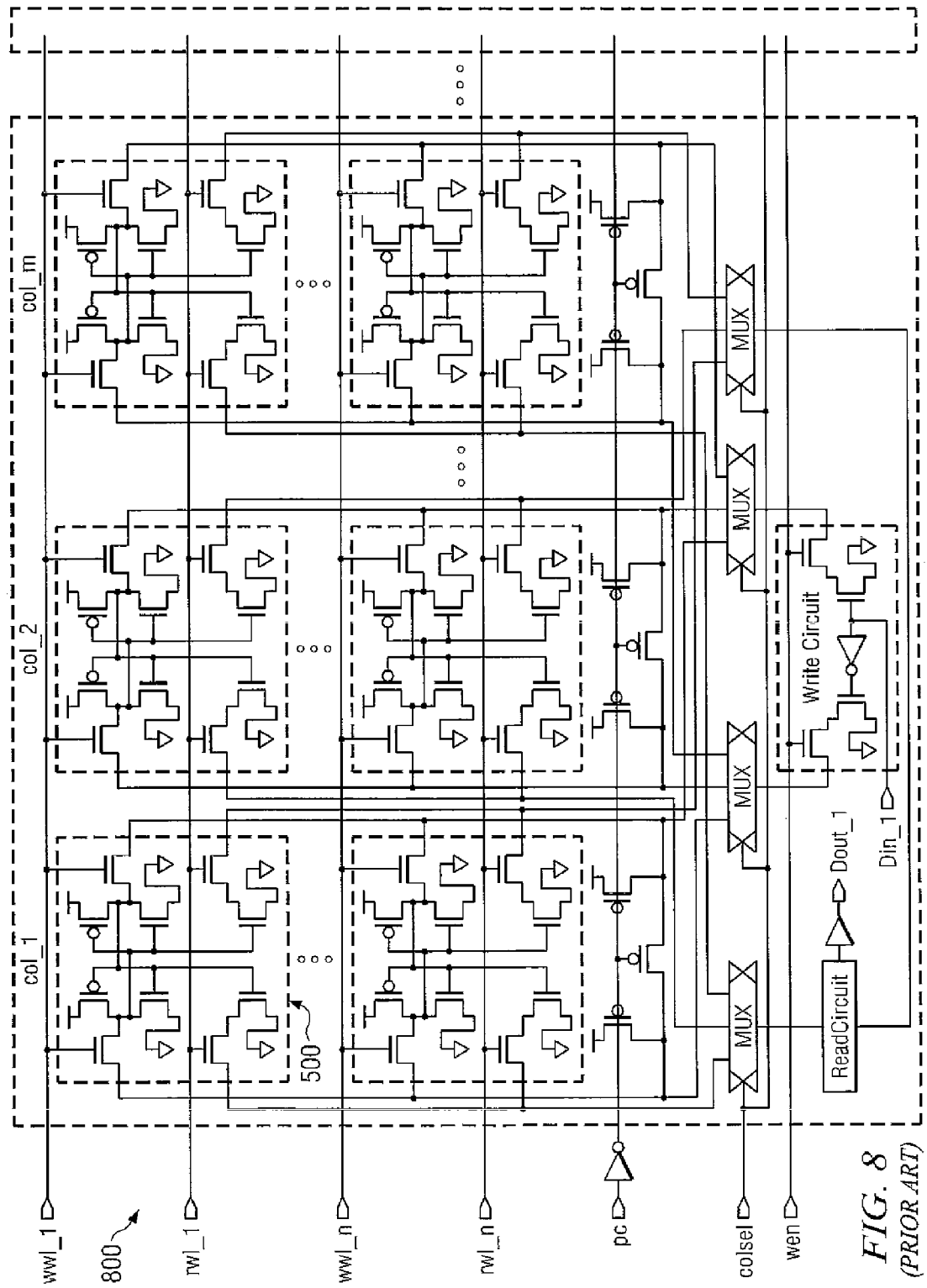
FIG. 8 is a schematic representation of an exemplary 10T SRAM array having a multi-column structure.
Figure 14:
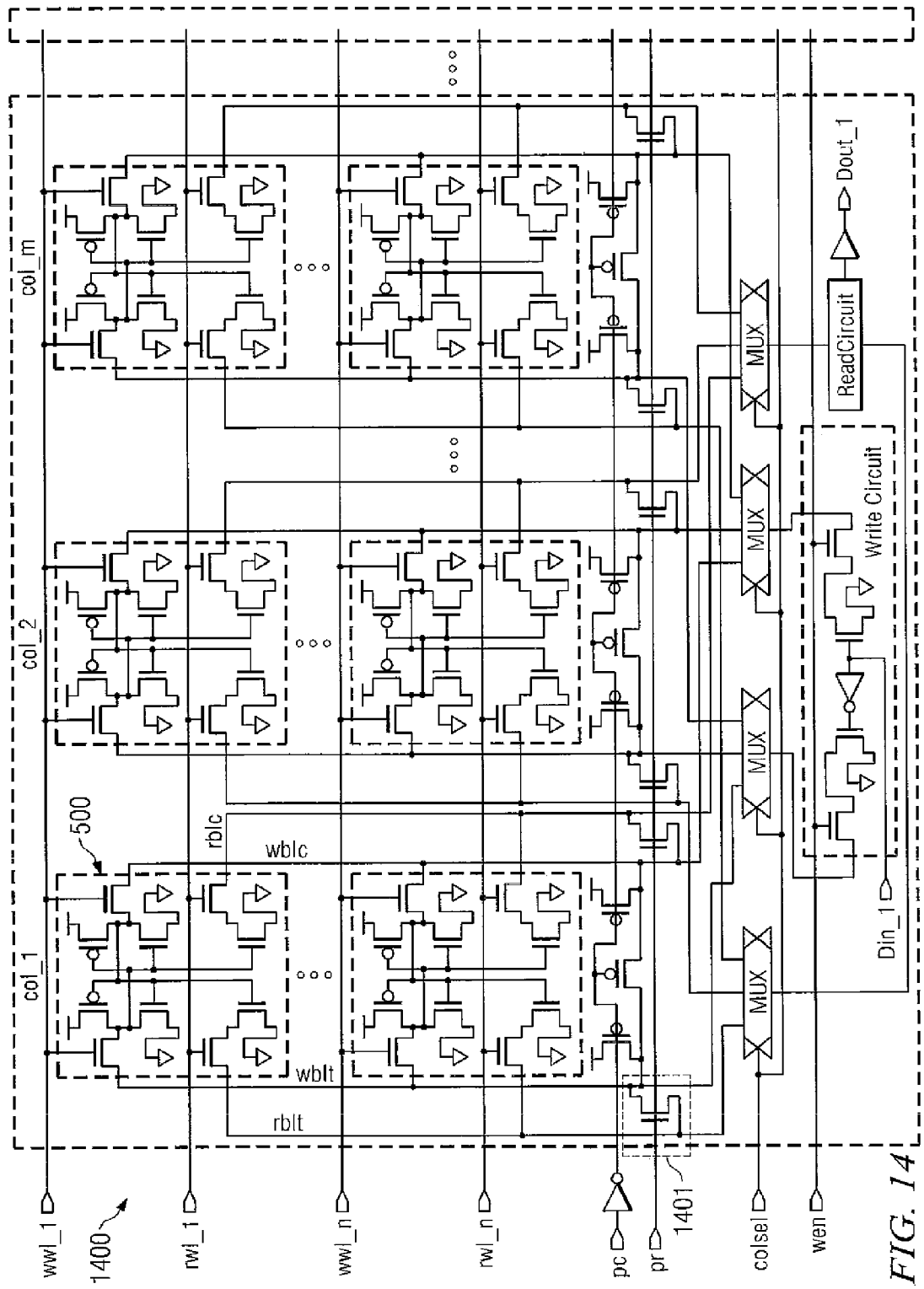
FIG. 14 is a schematic representation of a 10T SRAM array having a multi-column structure with a transfer device controlled by a pre-read signal, according to one embodiment of the invention.

FIG. 14 is a schematic representation of a 10T SRAM array 1400 having a multi-column structure, according to one embodiment of the invention. Array 1400 may utilize 10T SRAM cells with a conventional configuration (e.g., cell 500). In the exemplary embodiment shown in FIG. 14, array 1400 may comprise a plurality of columns (col_1 ... col_m) of 10T SRAM cells with a plurality of read wordlines (rwl_1 ... rwl_n) and write wordlines (wwl_1 ... wwl_n). As an example, in col_1, a transfer NMOS 1401 is added between a read bitline (rblt) and a write bitline (wblt). In this example, transfer device 1401 is controlled by a pre-read signal (pr). Similar to array 700 and array 800 described above with reference to FIGS. 7 and 8, array 1400 utilizes a multiplexer to select a column via colsel.

In the example shown in FIG. 14, the Read operation can be done in just about the same way as described above with reference to FIGS. 7 and 8 regarding 8T/10T SRAM arrays. The Write operation can be done as follows. First, the read bitlines and write bitlines are precharged to high via a precharge device (pc). Then, pc is turned off, and rwl and pr open, which turns on transfer device 1401. As transfer device 1401 is turned on, the voltage of one of write bitlines (wblt or wblc) is lowered in accordance with cell data stored therein. After this, write wordline (wwl) opens. As the bitline voltage has already been changed to the state which reflects the cell data in advance, the memory cells is sufficiently stable and thus difficult to flip. As an example, if $L_{poly}$=90 nm, the current of an SRAM cell in this embodiment should be 60 μA, the number of the cells on a bitline should be 64, the supply voltage should be 1.0 V, and the bitline voltage should be below 800 mV. Precharge time for reading from/writing to the bitline(s) would be 100 ps.

Figure 15:
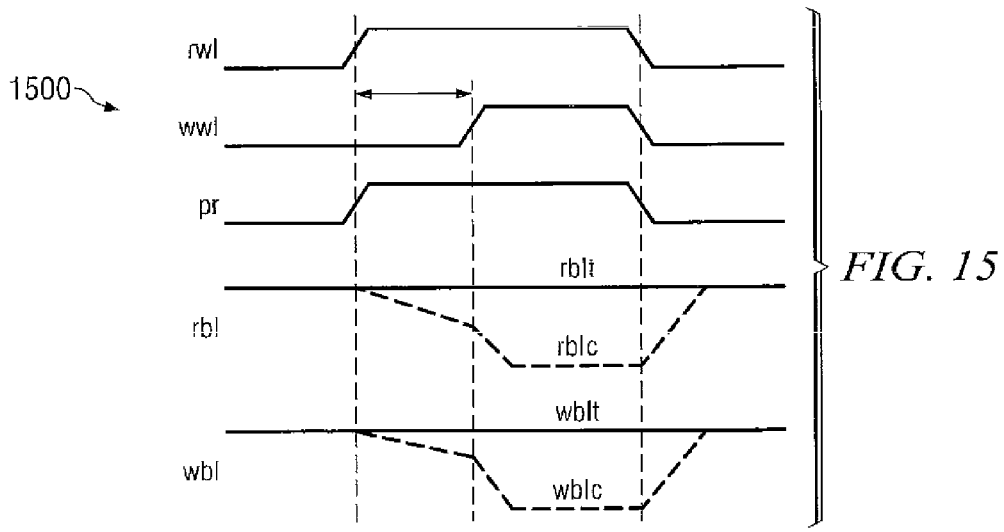
FIG. 15 is a diagram depicting a waveform illustrating the Read and Write operations of the 10T SRAM array of FIG. 14, according to one embodiment of the invention.

The design shown in FIG. 14 enables array 1400 to effectively avoid a cell stability problem which is common to a typical 10T SRAM array having a conventional multi-column structure where bitline voltages tend to reach the high state at the same time. FIG. 15 is a diagram depicting a waveform 1500 illustrating the Read and Write operations of array 1400. As can be seen in the example shown in FIG. 15, rblc is lowered during the Read operation and wblc is lowered during the Write operation. In the Read operation, a cell of array 1400 does not suffer from stability problems as no feedback is formed. The Write operation can be done as follows. First, the read bitlines and write bitlines are precharged to high via a precharge device (pc). Then, pc is turned off, and rwl open, which turns on transfer device 1401. As transfer device 1401 is turned on, the voltage of one of write bitlines (wblt or wblc) is lowered in accordance with cell data stored therein. After this, write wordline, (wwl) opens. As the bitline voltage has already been changed to the state which reflects the cell data in advance, the cell is sufficiently stable and thus difficult to flip.

Figure 16:
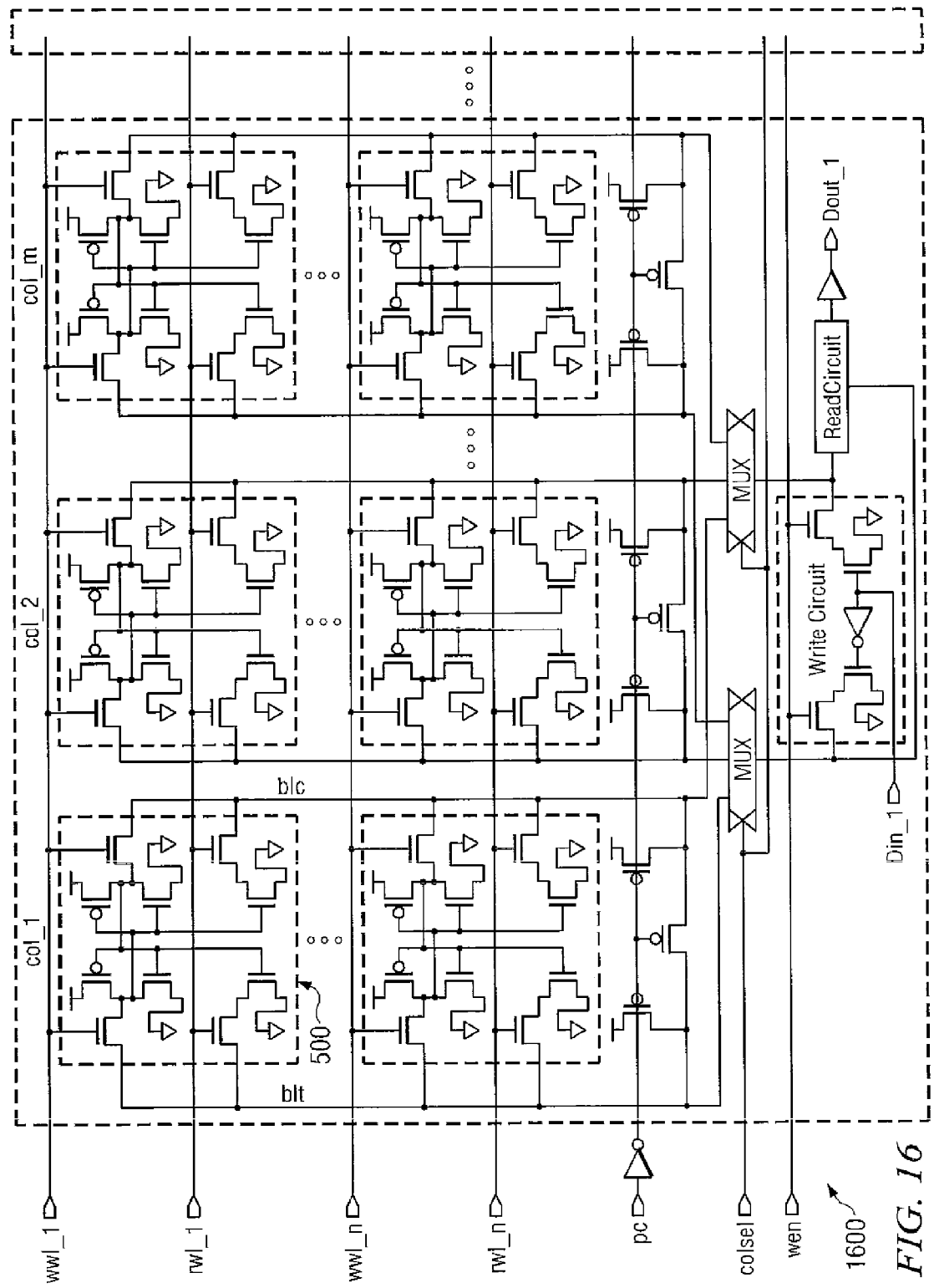
FIG. 16 is a schematic representation of a 10T SRAM array having a multi-column structure with shared read and write bitlines, according to one embodiment of the invention.

As one skilled in the art can appreciate, array 1400 may be modified without departing from the spirit of the invention. As an example, a variation of array 1400 is shown in FIG. 16. FIG. 16 is a schematic representation of a 10T SRAM array 1600 having a multi-column structure, according to one embodiment of the invention. In this example, the read and write bitlines are shared and the transfer device and pr are not needed. The rest of the signals can be controlled in just about the same way as described above. In embodiments described above, the delay of write wordlines (wwl) would be around 80 ps.

Figure 17:
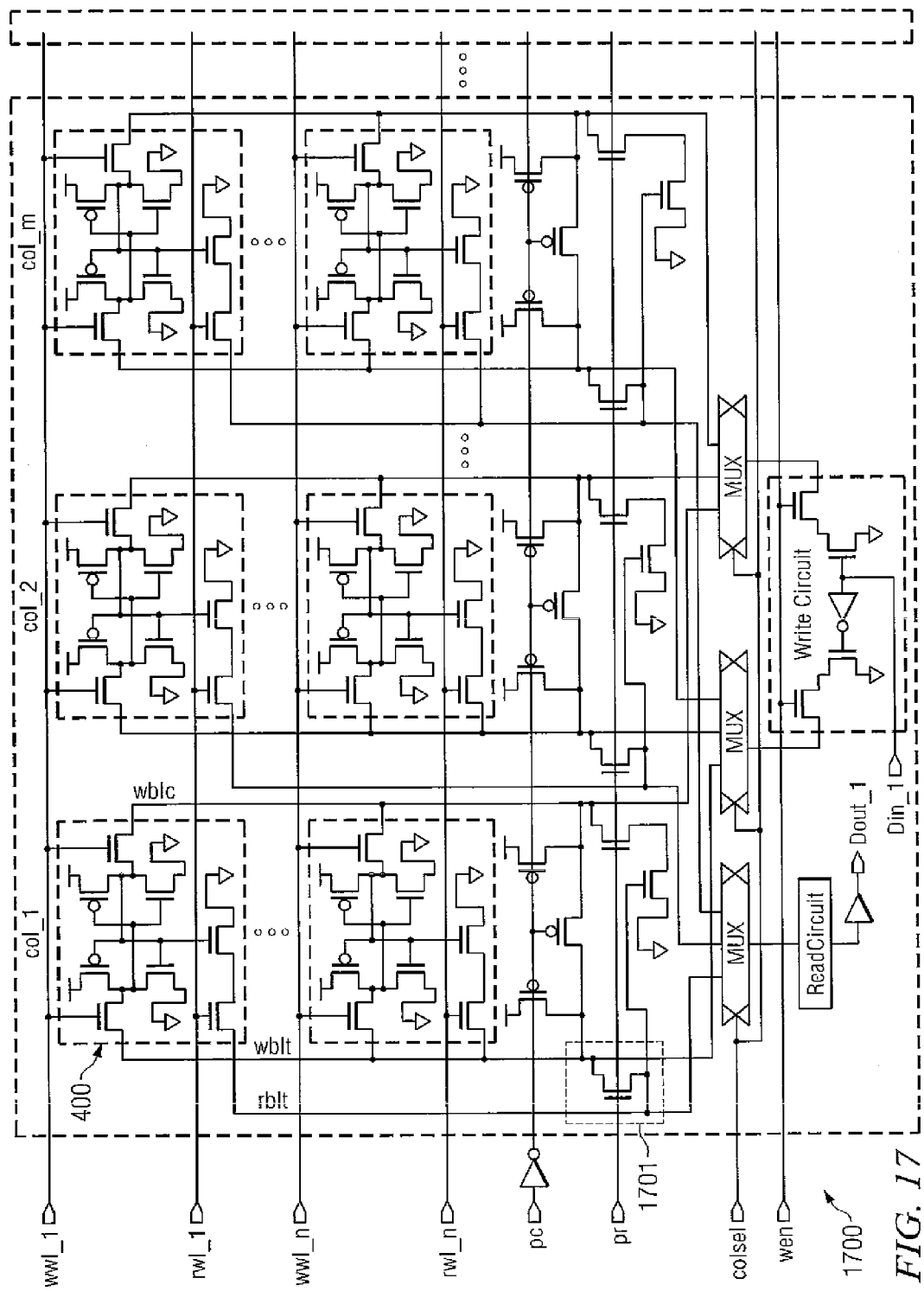
FIG. 17 is a schematic representation of an 8T SRAM array having a multi-column structure with a transfer device controlled by a pre-read signal, according to one embodiment of the invention.

FIG. 17 is a schematic representation of an 8T SRAM array 1700 having a multi-column structure, according to one embodiment of the invention. Array 1700 may utilize 8T SRAM cells with a conventional configuration (e.g., cell 400). In the exemplary embodiment shown in FIG. 17, array 1700 may comprise a plurality of columns (col_1 ... col_m) of 8T SRAM cells with a plurality of read wordlines (rwl_1 ... rwl_n) and write wordlines (wwl_1 ... wwl_n). As an example, in col_1, a transfer NMOS 1701 is added between a read bitline (rblt) and a write bitline (wblt). In this example, transfer device 1701 is controlled by a pre-read signal (pr). Similar to array 700 and array 800 described above with reference to FIGS. 7 and 8, array 1700 utilizes a multiplexer to select a column via colsel.

In the example shown in FIG. 17, the Read operation can be done in just about the same way as described above with reference to FIGS. 7 and 8 regarding 8T/10T SRAM arrays. The Write operation can be done as follows. The Write operation can be done in the following manner. First, the read and write bitlines are precharged to high via a precharge device (pc). Then, pc is turned off, and read worline (rwl) opens. After some delay, pr opens. When the cell data is "1", the read bitline stays high. Therefore, wblt stays high and wblc is pulled down. On the other hand, when the cell data is "0", the read bitline is pulled down. Therefore, wblt is pulled down and wblc stays high. After this, write wordline (wwl) opens. As the bitline voltage has already been changed to the state which reflects the cell data in advance, the memory cells remains relatively stable and thus can be difficult to flip. As one skilled in the art can appreciate, specific operating parameters, including delays, can vary depending upon a variety of factors (e.g., the CMOS technology used in manufacturing the cell and/or the SRAM array, the supply voltage, the current of the cell, the number of cells on a bitline, etc.). As an example, if $L_{poly}$=90 nm, the current of an SRAM cell in this embodiment should be 60 µA, the number of the cells on a bitline should be 64, the supply voltage should be 1.0 V, and the bitline voltage should be below 200 mV. Precharge time for reading from/writing to the bitline(s) would be 100 ps. The delay of pr would be around 80 ps and the delay of wwl would be around 160 ps.

Figure 18:
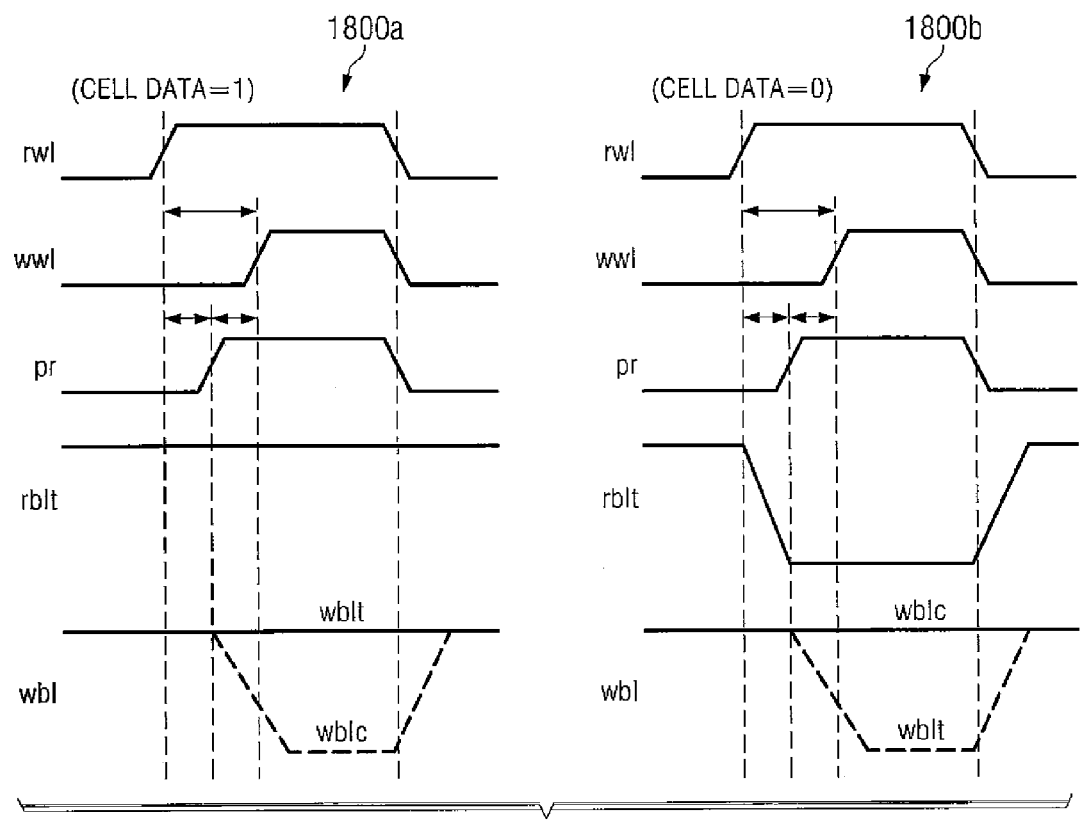
FIG. 18 diagrammatically depicts two waveforms of the 8T SRAM array of FIG. 17, according to one embodiment of the invention.

Like array 1400, array 1700 can avoid a cell stability problem by controlling how bitline voltages reach the high state. FIG. 18 diagrammatically depicts two waveforms 1800a and 1800b of array 1700. Waveform 1800a illustrates a scenario in which cell data is "1". Waveform 1800b illustrates a scenario in which cell data is "0". As exemplified in FIG. 18, wblc is lowered if cell data is "1" (waveform 1800a) and wblt is lowered if cell data is "0" (waveform 1800b).

Figure 19:
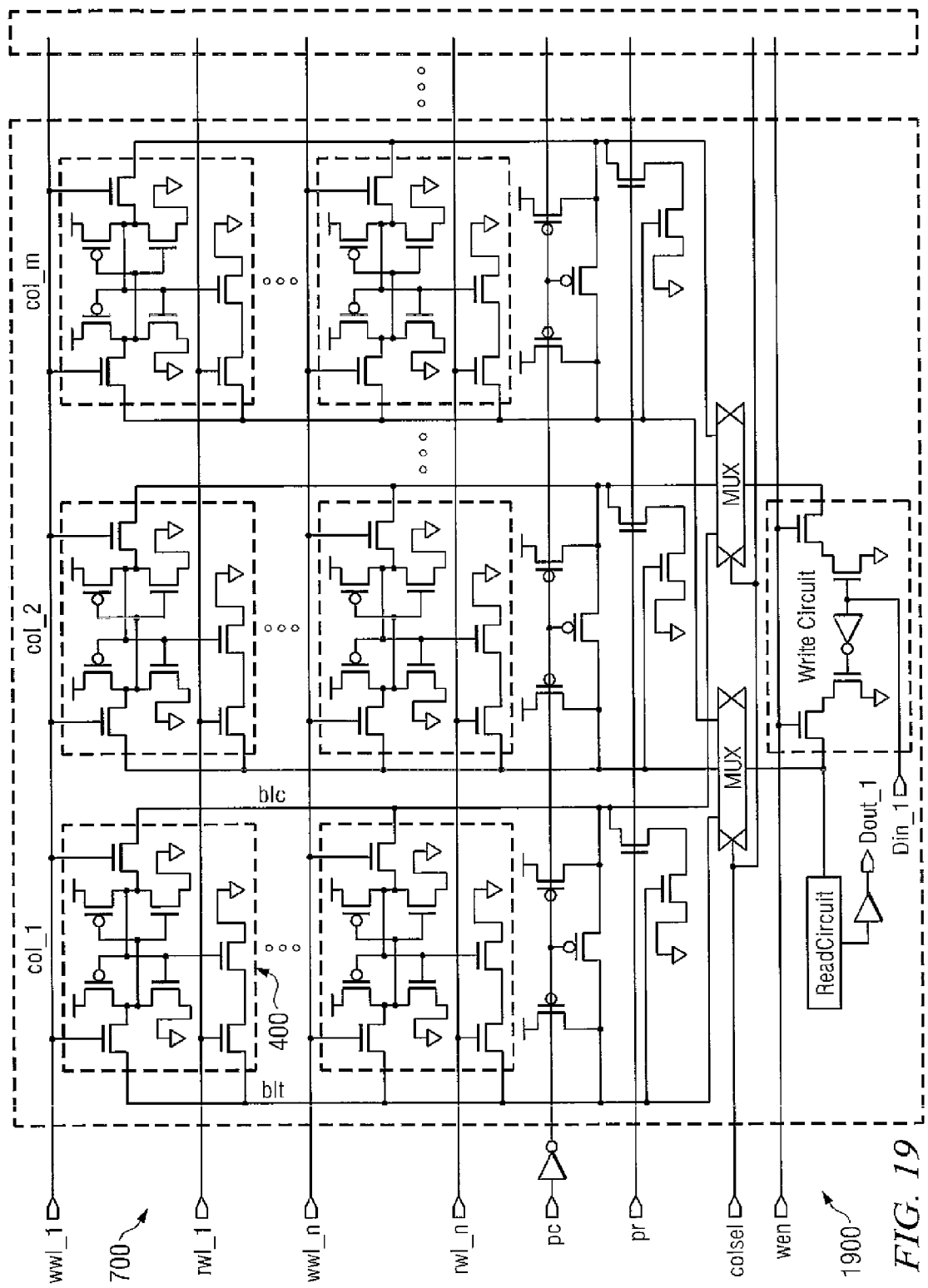
FIG. 19 is a schematic representation of an 8T SRAM array having a multi-column structure with shared read and write bitlines, according to one embodiment of the invention.

Like array 1400, array 1700 may be modified without departing from the spirit of the invention. As an example, a variation of array 1700 is shown in FIG. 19. FIG. 19 is a schematic representation of an 8T SRAM array 1900 having a multi-column structure, according to one embodiment of the invention. In this example, the read and write bitlines are shared. The rest of the signals, including pr, can be controlled in just about the same way as described above with reference to FIG. 17. The delay of pr would be around 320 ps and the delay of wwl would be around 400 ps.

Figure 20:
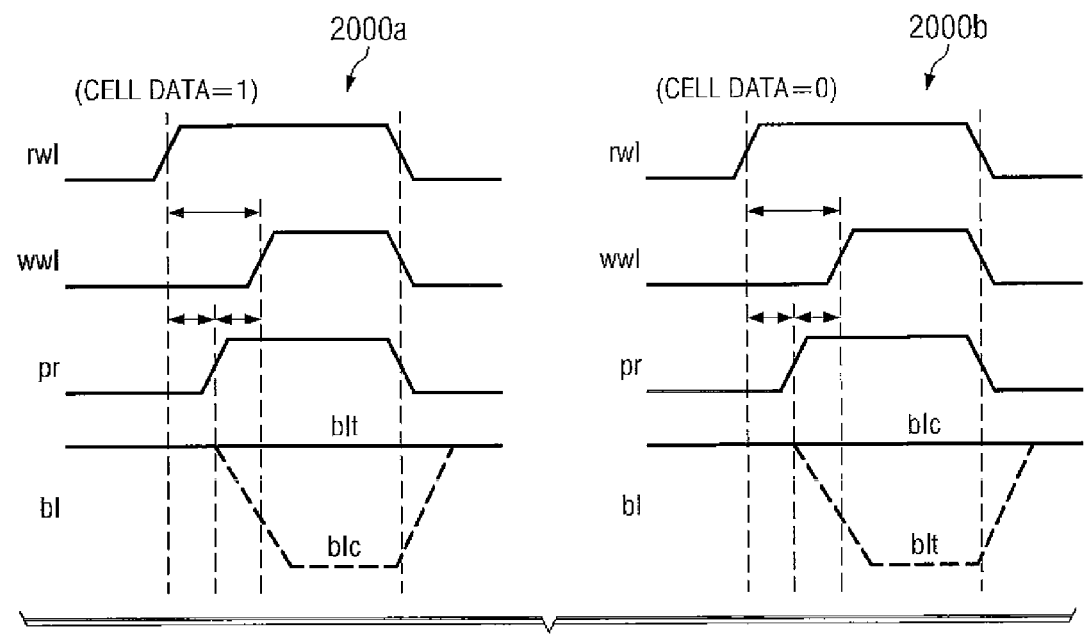
FIG. 20 diagrammatically depicts two waveforms of the 8T SRAM array of FIG. 19, according to one embodiment of the invention.

FIG. 20 diagrammatically depicts two waveforms 2000a and 2000b of array 1900. Waveform 2000a illustrates a scenario in which cell data is "1". Waveform 2000b illustrates a scenario in which cell data is "0". As exemplified in FIG. 20, the shared blc is lowered if cell data is "1" (waveform 2000a) and the shared bit is lowered if cell data is "0" (waveform 2000b).

In all embodiments of the invention, the bitline voltage is shifted before the wordline is activated and the voltage shifts in accordance with the data stored in the cell. Embodiments of the invention disclosed herein can relieve stress on accessed SRAM cells and thus facilitate cell stability while minimizing the increase in cell size.

Although the present invention has been described in detail herein with reference to the illustrative embodiments, it should be understood that the description is by way of example only and is not to be construed in a limiting sense. It is to be further understood, therefore, that numerous changes in the details of the embodiments of this invention and additional embodiments of this invention will be apparent to, and may be made by, persons of ordinary skill in the art having reference to this description. Accordingly, the scope of the invention should be determined by the following claims and their legal equivalents.

What is claimed is:

1. A static random access memory (SRAM) array comprising:
   a plurality of SRAM cells arranged in a plurality of columns, wherein each of said plurality of columns comprises:
   a first read bitline;
   a transfer NMOS coupled to said first read bitline;
   a first write bitline coupled to said transfer NMOS; and
   a pre-read device enabling a pre-read signal for controlling said transfer NMOS.

2. The SRAM array of claim 1, further comprising:
   a plurality of wordlines coupled to said plurality of SRAM cells.

3. The SRAM array of claim 1, further comprising:
   a precharge device coupled to said first read bitline and said first write bitline.

4. The SRAM array of claim 1, wherein said plurality of SRAM cells are 8T or 10T SRAM cells.

5. A method for avoiding cell data destruction caused by cell stability problems in a static random access memory (SRAM) device, said method comprising:
   precharging a first bitline of an SRAM cell to high;
   turning off said precharging;
   turning on a first word line;
   lowering voltage on said first bitline; and
   turning on a second wordline when said voltage on said first bitline is dropped to a state which reflects data inside of said SRAM cell.

6. The method of claim 5, further comprising transferring said data via a transfer device to a second bitline before turning on said second wordline.

7. The method of claim 6, further comprising controlling said transfer device via a pre-read signal.

8. The method of claim 5, wherein said SRAM cell has at least four transfer gates, two of which are coupled to said first wordline and two of which are coupled to said second wordline.

9. The method of claim 5, wherein turning on a first wordline lowers voltage on said first bitline.

10. The method of claim 9, further comprising transferring said data via a transfer device to a second bitline before turning on said wordline.

11. The method of claim 10, further comprising controlling said transfer device via a pre-read signal.

12. The method of claim 9, wherein said SRAM cell has at least four transfer gates, two of which are coupled to said first wordline and two of which are coupled to said second wordline.

13. A method of improving cell stability in a 6T static random access memory (SRAM) cell having
first wordline wl_1;
a second wordline wl_2;
a first bitline blt;
a second bitline blc;
a first transfer gate N2 coupled to wl_1 and blt;
a second transfer gate N3 coupled to wl_1 and blc;
a third transfer gate N4 coupled to wl_2 and blt; and
a fourth transfer gate N5 coupled to wl_2 and blc; said method comprising:
precharging bit and blc to high;
turning off said precharging;
turning on wl_1;
lowering a voltage on either blt or blc, depending upon data stored in said 6T SRAM cell; and
turning on wl_2 for a Read or Write operation.

14. The method of claim 13, further comprising transferring said data via a transfer device to bit or blc before turning on wl_2.

15. The method of claim 14, further comprising controlling said transfer device via a pre-read signal.

* * * * *